United States Patent [19]

Kamata

[11] Patent Number: 4,990,985
[45] Date of Patent: Feb. 5, 1991

[54] CHARGE COUPLED DEVICE HAVING A PARALLEL-SERIAL CONVERTING PORTION

[75] Inventor: Takao Kamata, Tokyo, Japan

[73] Assignee: NEC Corporation, Japan

[21] Appl. No.: 222,064

[22] Filed: Jul. 20, 1988

[30] Foreign Application Priority Data

Jul. 21, 1987 [JP] Japan .................................. 62-182741

[51] Int. Cl.⁵ ...................... H01L 29/78; H01L 27/14
[52] U.S. Cl. ....................................... 357/24; 357/30; 377/57; 377/60; 377/61; 377/62; 377/63
[58] Field of Search ................ 357/24 LR, 24 M, 24, 357/30 D, 30 F, 30 H, 30 Q, 30 R; 377/57, 60, 61, 62, 63

[56] References Cited

U.S. PATENT DOCUMENTS 4,484,210 11/1984 Shiraki et al. .......................... 357/24

OTHER PUBLICATIONS

RCA Technical Notes, Jun. 8, 1976, "High Speed CCD Line Imager", Eric Herrmann, pp. 1-4.
Charge Transfer Devices, Sequin and Tompsett, 1975, Academic Press Inc., pp. 160-169.

Primary Examiner—Andrew J. James
Assistant Examiner—Ngan Van Ngo
Attorney, Agent, or Firm—Laff, Whitesel, Conte & Saret

[57] ABSTRACT

A charge coupled device includes a plurality of first CCD shift-registers transferring charge signals in parallel and a second CCD shift-register receiving the charge signals from the first CCD shift-registers for a parallel-serial coversion, the second CCD shift-register being connected to the first CCD shift-registers through barrier regions covered with electrodes in the second CCD shift-register.

4 Claims, 2 Drawing Sheets

CHARGE COUPLED DEVICE HAVING A PARALLEL-SERIAL CONVERTING PORTION

BACKGROUND OF THE INVENTION

1. Field of the Invention

This invention relates to a charge coupled device (hereinafter, referred to a CCD) having a parallel-serial converting portion, and more particularly to a charge coupled device such as an area image sensor having a plurality of vertical CCD shift-register and a horizontal CCD shift-register receiving charges from the vertical CCD shift-registers for parallel-serial conversion.

2. Background of the Invention

A CCD area image sensor is formed of a plurality of photo-detector elements arranged in rows and columns, a plurality of vertical CCD registers each disposed in parallel with each column of the photo-detector elements to transfer charges accumulated in the photo-detector elements and a horizontal CCD registers receiving charges from the vertical CCD registers for parallel-serial conversion of charge information. The photo-detectors accumulate charges in response to irradiation of light information. The accumulated charges are simultaneously transferred to the vertical CCD shift-registers to further transfer to the horizontal CCD shift-register. The horizontal CCD shift-register produces the charge information arranged in series which is obtained in a voltage form at a charge-voltage converter provided at an edge of the horizontal CCD shift-register.

The vertical and horizontal CCD shift-registers are driven by two-or four-phase clock pulses. Especially, the horizontal CCD shift-register receives the charges at portions under transfer gate electrodes supplied with the same phase clock from the vertical shift-register. In a non-interlace scanning of the photo-detector array, since the clock pulse applied to the final stage transfer gate electrodes of the vertical CCD shift-registers which are closest to the horizontal CCD shift-register are held at a grounding potential or the lowest potential during the charge-transfer operation of the horizontal CCD shift-register, the charges can be transferred through the horizontal CCD shift-register without going back to the vertical CCD shift-registers. However, in an interlace scanning, the clock pulse applied to the final stage transfer gate electrode changes its phase at every scanning fields. Accordingly, there are scanning fields in which the clock pulse applied to the final stage transfer gate electrode is held at a high potential during the charge transfer operation of the horizontal CCD shift-register. In such case, charges in the horizontal CCD shift-register erroneously go back to the vertical CCD shift-registers.

In order to prevent charges in the horizontal CCD shift-register from going back to the vertical CCD shift-register, the CCD area image sensor in the prior art has a particular final stage electrode in the respective vertical CCD shift-registers. The particular final stage electrode is formed at a position closest to the horizontal CCD shift-register and supplied with a particular pulse. The particular pulse has a high level to allow charges to be transferred from the vertical CCD shift-registers to the horizontal CCD shift-register through the particular final stages. This prior art was proposed in a U.S. Pat. No. 3,971,003 granted to Walter F. Kosonocky.

The proposed measurement has some drawbacks. First is a requirement of a generator of the particular pulse. The CCD area image sensor itself requires many pulses for driving the vertical and horizontal CCD shift-registers, for transferring charges from the photo-detector elements to the vertical CCD shift-registers and for driving other circuit portions such as charge-voltage converter. The increment of necessary pulses makes the pulse generator very complexed. Moreover, if the particular pulse has even a small asynchronism with the operation of the horizontal CCD shift-register, the charges in the horizontal CCD shift-register go back to the vertical CCD shift-register. Therefore, the pulse width of the low level signal in the particular pulse should be designed to be wider than an operating period of the horizontal CCD shift-register for allowing the above-mentioned small asynchronism. This allowance of the pulse width in the particular pulse makes the improvement of high speed operation difficult.

Another measurement in the prior art is application of a particular D.C. potential to the final stage transfer gate electrode instead of the particular pulse. The particular D.C. potential is a half potential of the potential difference between high and low levels of the clock pulses applied to the vertical CCD shift-register. This measurement is somewhat effective in the image sensor using buried channel type CCD shift-registers. The buried channel type CCD keeps some potential well when the clock pulse has a grounding potential. The charges to be stored in a potential difference between the particular D.C. potential and the potential well at the grounding level of clock pulse are a maximum value of charges transferable in the horizontal CCD shift-register. This transferable charge value is easily affected from changes in the particular D.C. potential and impurity concentration of the buried channel type CCD and is impossible to be made large. Furthermore, if the horizontal CCD shift-register is driven in a sharp clock pulse, charges in the horizontal CCD shift-register go back to the vertical CCD shift-registers prior to charge-transfer along the horizontal CCD shift-register. This sharp clock easily appears in normal clock pulse as an undershoot which is caused by capacitive couplings between transfer gate electrodes, resulting in a limit in high speed operation.

SUMMARY OF THE INVENTION

It is a major object of the present invention to provide a charge coupled device having parallel and serial transfer sections for a parallel-serial conversion in which final stage transfer gate electrodes are removed from the parallel transfer section.

It is another object of the present invention to provide a charge coupled device having a parallel-serial converting portion which is simple in structure and which is operable in a high speed.

According to the present invention, there is provided a charge coupled device having a plurality of first CCD shift registers transfering charge signals in parallel and a second CCD shift-register receiving the charge signals from the first CCD shift registers for a parallel-serial conversion of the charge signals, channel region in the second CCD shift-register being connected through barrier regions covered with electrodes in the second CCD shift-register.

The selected gate electrodes cover the barrier region together with the channel region in the second CCD shift-register. Only by applying a clock pulse to the selected gate electrodes, potential barriers against a charge flow for going back to the first CCD shift-registers from the second CCD shift-register are always formed. Therefore, the particular final stage transfer gate electrodes supplied with a paticular pulse or D.C. potential are not required to simplify a whole structure and operating pulse generator. Furthermore, since the potential barriers are automatically formed by application of clock pulse to the second CCD shift-register, the operation speed of the second CCD shift-register can be increased without going back charges to the first CCD shift registers. Especially, the barrier is automatically formed, if the clock pulse becomes sharp by undershoot caused by capacitive coupling between transfer gates. Thus, the high speed operation is not damaged by the undershoot in clock pulse. Moreover, the transferable charge value through the second CCD shift-register is arbitrarily set by controlling the impurity concentration in the high impurity concentration regions. This value may be made larger, compared to the prior art using the particular D.C. potential.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENT

Figure 1:
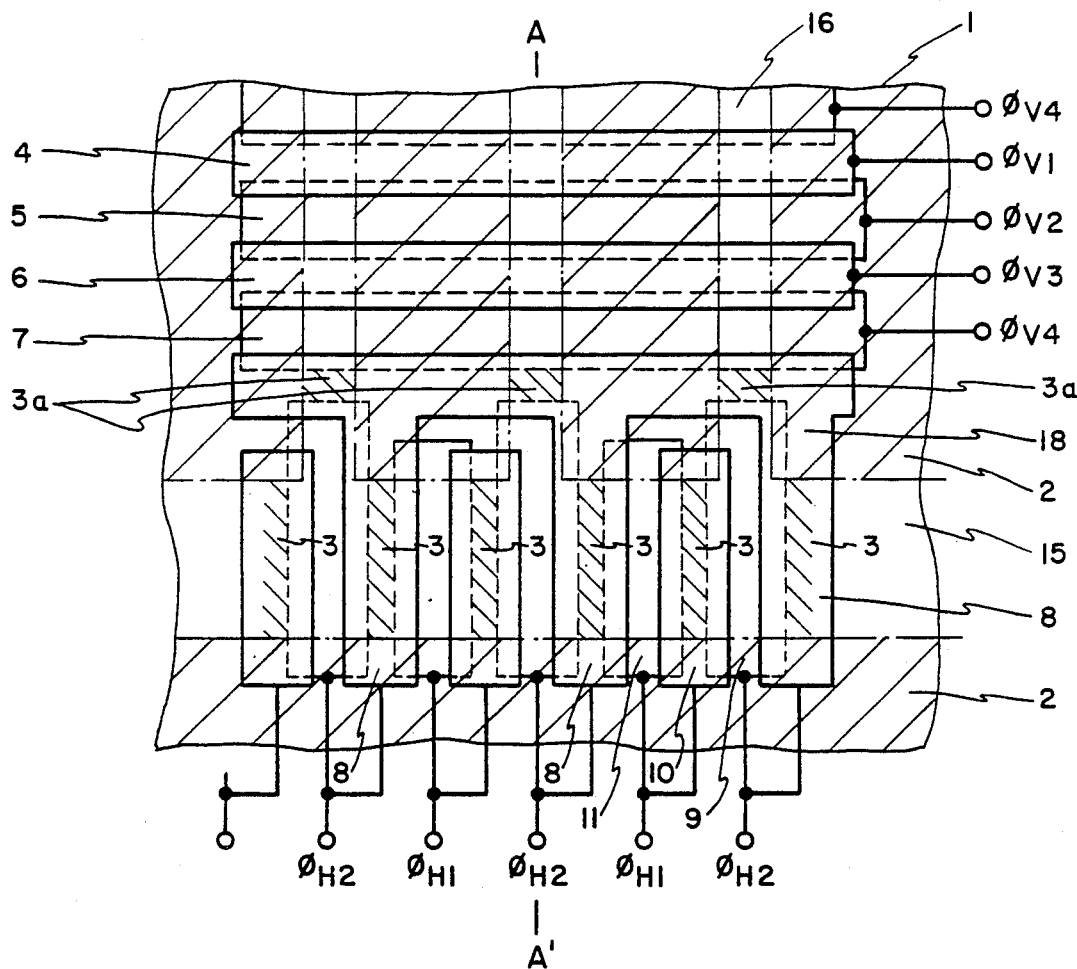
FIG. 1 is a plan view of a principal part of a first preferred embodiment of the present invention.
Figure 2:
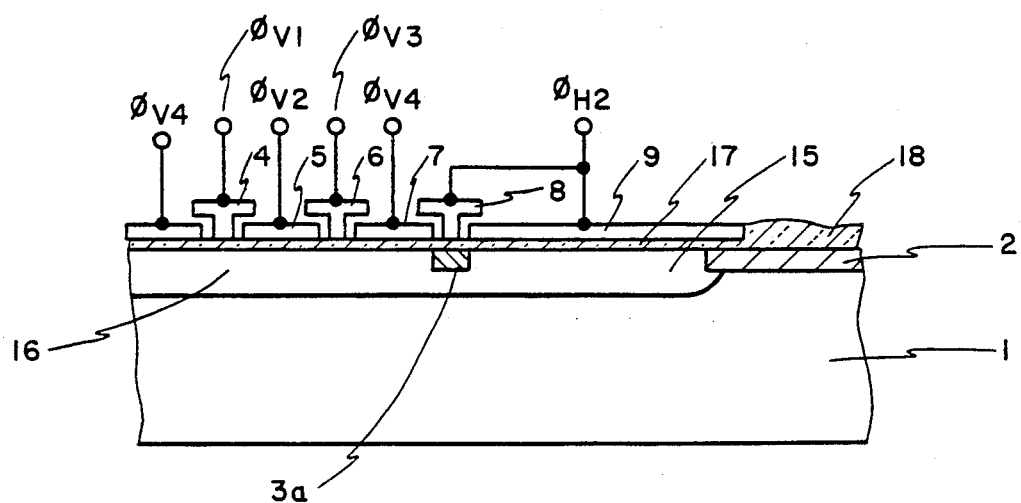
FIG. 2 is a sectional view taken along the line A—A' in FIG. 1.
Figure 3:
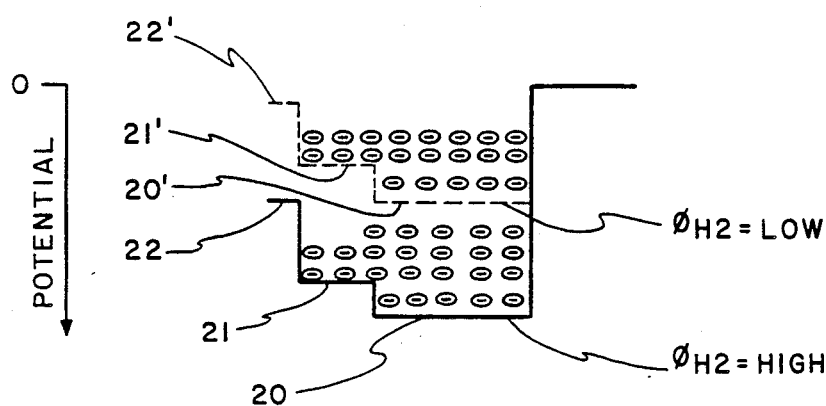
FIG. 3 is a diagram showing a change in potential under a transfer gate electrode supplied with a clock pulse $\phi_{H2}$ in FIGS. 1 and 2.

A parallel-serial converter using CCD shift-registers are shown in FIGS. 1, 2 and 3 as the first preferred embodiment of the present invention. A P-type silicon substrate having a resistivity of 10 to 15 ohm.cm is used as a substrate 1. At a surface of the substrate 1, three lines of N-type well regions 16 and a stripe of another N-type well region 15 are formed as channel regions for vertical and horizontal CCD shift-registers of buried channel type. These N-type well regions have an impurity concentration of 1 to $3 \times 10^{16}$ cm$^{-3}$ and a depth of 0.6 $\mu$m, respectively. At the surface of the substrate 1 except for the N-type well regions 15 and 16, a channel stopper region 2 is formed with a P$^+$-type impurity concentration of 5 to $10 \times 10^{17}$ cm$^{-3}$ and a depth of about 0.6 $\mu$m. A thin silicon oxide film 17 having a thickness of 600 to 900 Å is formed to cover the N-type well regions 15 and 16 as a gate insulator film. A thick silicon oxide film 18 having a thickness of about 1 $\mu$m is formed over the channel stopper region 2.

The three vertical CCD shift-registers are formed by forming a plurality of transfer gate electrodes 4, 5, 6 and 7 so as to cross the N-type well regions 16 via the thin and thick silicon oxide films 17 and 18. Those transfer gate electrodes 4, 5, 6 and 7 are formed with a two layer structure. The transfer gate electrodes 5 and 7 are lower layer electrodes of polycrystalline silicon covered with silicon oxide film. The other transfer gate electrodes 4 and 6 are upper layer electrodes having parts overlying their adjacent lower layer electrodes 5 and 7 and being made of polycrystalline silicon or aluminium. Those transfer gate electrodes 4, 5, 6 and 7 are supplied with four-phase clock pulses $\phi_{V1}$, $\phi_{V2}$, $\phi_{V3}$ and $\phi_{V4}$ to simultaneously drive the vertical shift registers.

The horizontal CCD shift-register is formed by disposing transfer gate electrodes 8, 9, 10 and 11 on the N-type well region 15. The transfer gate electrodes 8, 9 10 and 11 are also formed with two layer structure. Lower layer electrodes 9 and 11 are formed of polycrystalline silicon layer covered with silicon oxide film. By using those lower layer electrodes 9 and 10 as a mask, barrier regions 3 having an N-type impurity concentration of 2 to $5 \times 10^{15}$ cm$^{-3}$ are formed by ion-implantation of P-type impurities. Similar impurity ion-implantation is carrier out with a mask of the lower layer electrode 7 and 9 to form barrier regions 3a having an N$^+$-type impurity concentration of 2 to $5 \times 10^{15}$ cm$^{-3}$ at connecting portion of the N-type well regions 16 with the N-type well region 15. Upper layer electrodes 8 and 10 are formed on those barrier regions 3 with polycrystalline silicon or aluminium so as to overlie their adjacent lower layer electrodes 9 and 11. The upper layer electrodes 8 are connected with each other by a connecting electrode 18 disposed in parallel with the transfer gate electrodes 4, 5, 6 and 7 for the vertical CCD shift-registers. The connecting electrode 18 overlies the barrier regions 3a. The impurity concentration of the barrier region 3a should be selected in accordance with the required charge value transferable through the horizontal shift-register formed along the N-type well region 15.

The horizontal shift register is driven with two-phase clock pulses $\phi_{H1}$ and $\phi_{H2}$. The clock pulse $\phi_{H1}$ is applied to the lower layer electrode 11 and the upper layer electrode 10. The other clock pulse $\phi_{H2}$ is applied to the lower layer electrode 9 and the upper layer electrode 8 together with the connecting electrode 18.

The change in potential wells at a portion under the lower layer electrode 9 and the barrier region 3a under the connecting electrode 18 will next be explained with reference to FIG. 3. When the clock pulse $\phi_{H2}$ has a high level potential, the potential under the lower layer electrode 9 becomes to have levels 20 and 21 of the solid line. The stepped level 21 is generated by a narrow channel effect occurring at the narrow N-type regions 16. In the same time, the potential at the barrier regions 3a is as shown by the solid line 22. The charge value in the potential well enclosed by the solid lines 20, 21 and 22 is a transferable charge value. The potential well enclosed by the solid lines 20, 21 and 22 is raised as shown by the dotted lines 20', 21' and 22' with keeping their mutual relation, when the clock pulse $\phi_{H2}$ is lowered to a lower potential or a grounding potential. The same transferable charge value is kept without going back to the vertical CCD shift-registers, in stead of any potential level of the clock pulse $\phi_{V4}$.

The potential barrier shown by the solid line 22 and the dotted line 22' is always generated in accordance with the clock pulse $\phi_{H2}$ and the impurity concentration in the barrier region 3a. This potential barrier defines the maximum transferable charge value through the horizontal CCD shift-register and functions as a barrier for preventing charges in the horizontal CCD shift-register from going back to the vertical CCD shift-registers. Thus, the final stage transfer gate electrode is not required in the vertical CCD shift-registers. This removal of the final stage electrode allows to disuse the particular pulse or the particular D.C. potential required in the prior art device, resulted in a possibility of high speed operation. This is because the particular pulse requiring a timing allowance for the clock pulses of the horizontal shift-register is not used. Another reason is because a sufficient barrier is formed even if the horizontal shift-register is driven by sharp clock pulses.

The potential barrier of the solid line 22 and the dotted line 22' always keep its potential difference from the potential at the channel region of the solid lines 20 and 21 and the dotted line 20' and 21'. The potential difference can be controlled to have a considerable value by the impurity concentration of the barrier region 3a. In this way, the maximum transferable charge value can be precisely controlled and can be made large, compared to the prior art device using the final stage electrode supplied with the particular D.C. potential.

It is needless to say that the removal of the final stage electrode makes the device structure and the driving pulse generator simple. The barrier regions 3a are formed with an ion-implantation using a mask of lower layer electrodes 7 and 9 in the same ion-implantation process for forming the barrier regions 3 in the N-type well region 15. Any additional manufacturing steps are not required by the formation of the barrier regions 3a.

Figure 4:
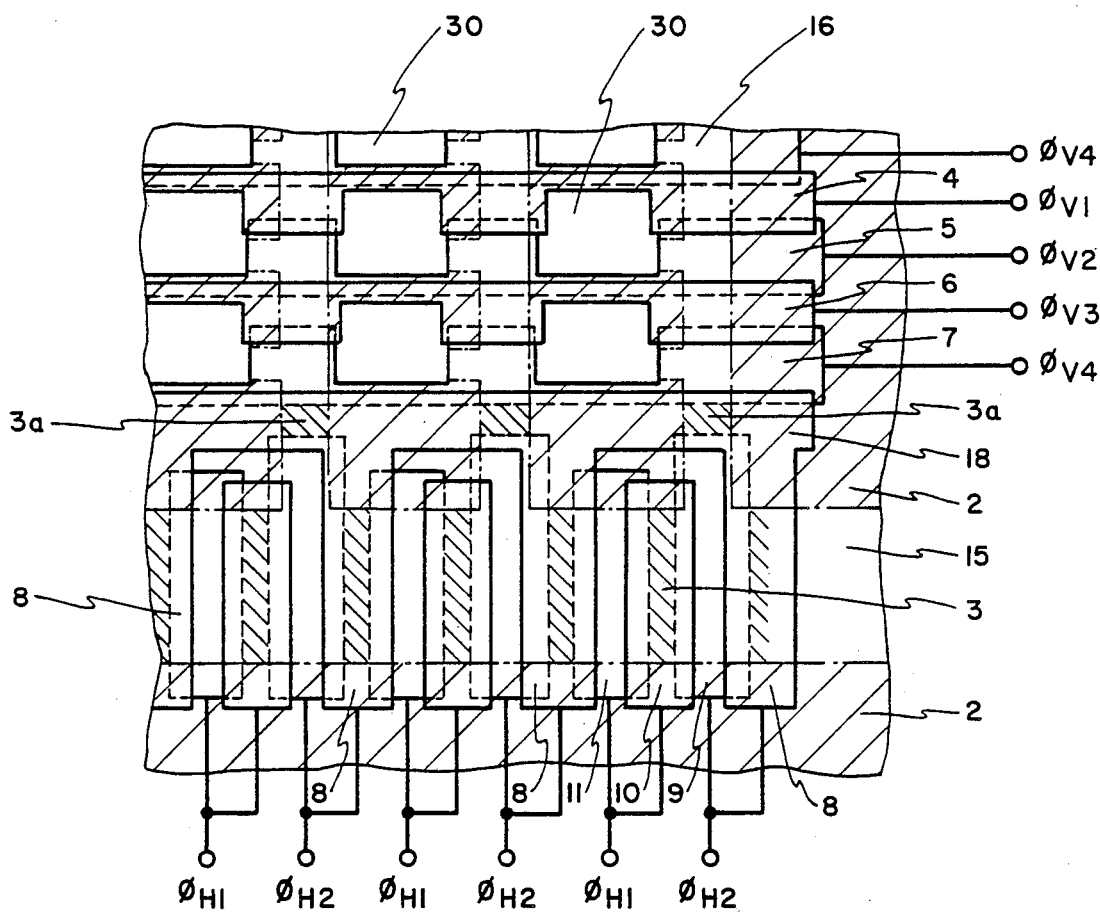
FIG. 4 is a plan view of a principal part of a second preferred embodiment of the present invention.

The second preferred embodiment of the present invention shown in FIG. 4 is a CCD area image sensor. Major part of the CCD area image sensor is similar to the parallel-serial converter shown in FIGS. 1 and 2 and uses the same reference numerals for the same portions to omit their explanations. A plurality of photo-detector elements 30 are inserted between N-type well regions 16. Each photo-detector elements 30 are formed of P-type regions formed in an N-type well region (not shown in FIG. 4). The N-type well regions 16 have connecting portions to adjacent photo-detector elements 30. The transfer gate electrodes 4, 5, 6 and 7 have, respectively, many concaves to expose the photo-detector elements 30. The transfer gate electrodes 5 and 7 which cover the connecting portions of the N-type well regions 16 to the photo-detector elements, are supplied with a clock pulse superimposed with a charge transfer pulse having a potential higher than a high level potential in a clock pulse for charge transfer through a CCD shift-register. With the charge transfer pulse, charges accumulated in the photo-detector elements in accordance with the irradiated light are transferred to the vertical CCD shift-registers. The transferred charges are parallely shifted along the vertical CCD shift-registers to the horizontal CCD shift-register for parallel-serial conversion.

According to the area image sensor of the present invention, an interlace scanning is easily achieved with a simple device structure and a decreased number of control pulses. Since the interlace scanning can be performed with high speed clock pulses, the number of photo-detector elements integrated in a single image sensor chip to improve resolution.

Although impurity concentration regions are used as barrier regions for preventing charges in the horizontal shift-register from going back to the vertical shift-registers, such barrier regions may be formed with a thick insulator film. The inventive feature of the present invention may be applicable to a parallel-serial converter using surface channel type CCD, in stead of buried channel type CCD used in the above-mentioned embodiment of the present invention. In the case using the surface channel type CCD's, the barrier regions should be the same conductivity type regions as the substrate but should have an impurity concentration higher than the substrate.

What is claimed is:

1. A parallel-serial converter using CCD shift-registers, said converter comprising:
   a semiconductor substrate;
   a plurality of first channel regions formed in said semiconductor substrate in parallel with each other, said first channel regions having a first impurity concentration of one conductivity type;
   a second channel region formed in said semiconductor substrate to extend in a direction crossing said first channel regions, respective one ends of said first channel regions being connected to said second channel region, said second channel regions having a second impurity concentration of said one conductivity type;
   a plurality of first transfer gate electrodes overlying all of said first channel regions via an insulator film to form a plurality of first CCD shift-registers;
   a plurality of second transfer gate electrodes overlying said second channel region via an insulator film to form a second CCD shift-register, predetermined ones of said second transfer gate electrodes extending to cover respective portions of said first channel regions; and
   impurity regions formed in said first channel regions at said respective portions covered with said second transfer gate electrodes, said impurity regions having a third impurity concentration of said one conductivity type which is different from said first impurity concentration but having a value for producing a potential difference which prevents charges transferred through said impurity regions into a region under said first transfer gate electrode.

2. A parallel-series converter using CCD shift-registers as claimed in claim 1, wherein said one conductivity type is opposite to a conductivity of said semiconductor substrate.

3. A parallel-series converter using CCD shift-registers as claimed in claim 1, wherein said one conductivity type is the same as a conductivity type of said semiconductor substrate and said first and second impurity concentrations are higher than an impurity concentration of said semiconductor substrate.

4. A CCD area image sensor comprising:
   a semiconductor substrate;
   a plurality of photo-detector elements formed in said semiconductor substrate so as to form rows and columns of said elements, said photo-detector elements accumulating changes in accordance with irradiated light;
   a plurality of first electrodes overlying said plurality of first channels via an insulator film to form a plurality of vertical shift-registers;
   means for transferring charges accumulated in said photo-detector elements to said vertical shift-registers;
   a second channel formed in said semiconductor substrate in contact with respective one ends of said first channel regions;
   a plurality of second electrodes formed on said second channel to form a horizontal shift-register, predetermined electrodes of said second electrodes extending to cover respective end parts of said first channels including said one ends of said first channels; and barrier regions formed in said respective end parts of said first channels, said barrier regions being the same conductivity type as said first and second channels and having an impurity concentration which is different from a concentration of said first and second channels, and each of said barrier regions forming a barrier for preventing charges in said second channel from going to said first channels.

* * * * *